United States Patent
Lee et al.

(10) Patent No.: US 11,462,577 B2
(45) Date of Patent: Oct. 4, 2022

(54) IMAGE DEVICE AND FABRICATING METHOD THEREOF

(71) Applicant: SAMSUNG ELECTRONICS CO., LTD., Suwon-si (KR)

(72) Inventors: Kyu Min Lee, Seoul (KR); Ju-Eun Kim, Hwaseong-si (KR); Soo Jin Hong, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 169 days.

(21) Appl. No.: 16/926,897

(22) Filed: Jul. 13, 2020

(65) Prior Publication Data

US 2021/0175266 A1 Jun. 10, 2021

(30) Foreign Application Priority Data

Dec. 5, 2019 (KR) .................. 10-2019-0160452

(51) Int. Cl.
*H01L 27/146* (2006.01)

(52) U.S. Cl.
CPC .. *H01L 27/14603* (2013.01); *H01L 27/14612* (2013.01); *H01L 27/14683* (2013.01)

(58) Field of Classification Search
CPC combination set(s) only.
See application file for complete search history.

(56) References Cited

U.S. PATENT DOCUMENTS

| 2008/0128824 | A1 | 6/2008 | Oh |
| 2014/0361385 | A1* | 12/2014 | Zaka .................. H01L 29/51 438/585 |

FOREIGN PATENT DOCUMENTS

| KR | 10-2004-0040822 | 5/2004 |
| KR | 10-2005-0000190 | 1/2005 |
| KR | 10-2003-0054743 | 7/2006 |
| KR | 10-2006-0077625 | 7/2006 |
| KR | 10-0660275 | 12/2006 |

\* cited by examiner

*Primary Examiner* — Suberr L Chi
(74) *Attorney, Agent, or Firm* — F. Chau & Associates, LLC

(57) ABSTRACT

An image device includes a first active region and a second active region disposed on a substrate. Each of the first active region and the second active region includes a gate insulating layer disposed on the substrate and a gate electrode disposed on the gate insulating layer. At least one of the first active region and the second active region further includes a first passivation layer containing fluorine (F) disposed between the gate insulating layer and the gate electrode. A concentration of fluorine in the gate insulating layer is higher than a concentration of fluorine in the gate electrode.

20 Claims, 20 Drawing Sheets

IMAGE DEVICE AND FABRICATING METHOD THEREOF

CROSS-REFERENCE TO RELATED APPLICATION

This application claims priority under 35 U.S.C. § 119 to Korean Patent Application No. 10-2019-0160452, filed on Dec. 5, 2019 in the Korean Intellectual Property Office, the disclosure of which is incorporated by reference in its entirety herein.

1. Technical Field

The present invention relates to an image device and a fabricating method thereof.

2. Discussion of Related Art

An image sensor is a semiconductor device that converts an optical image into an electrical signal. Image sensors may be classified into a charge coupled device (CCD) type and a complementary metal oxide semiconductor (CMOS) type. A CMOS type image sensor (CIS) includes a plurality of pixels arranged two-dimensionally. Each of the pixels includes a photodiode. The photodiode converts incident light into an electrical signal.

Recently, with the development of computer and communication industries, there has been an increased demand for image sensors with improved performance for a variety of applications such as a digital camera, a camcorder, a personal communication system (PCS), a tame device, a surveillance camera, a medical micro camera and a robot. In addition, as semiconductor devices have become highly integrated, in age sensors may also become highly integrated.

SUMMARY

Aspects of the present inventive concepts provide an image device having an improved structural quality using a passivation layer containing fluorine.

According to an exemplary embodiment of the present inventive concepts, an image device includes a first active region and a second active region disposed on a substrate. Each of the first active region and the second active region includes a gate insulating layer disposed on the substrate and a gate electrode disposed on the gate insulating layer. At least one of the first active region and the second active region further includes a first passivation layer containing fluorine (F) disposed between the gate insulating layer and the gate electrode. A concentration of fluorine in the gate insulating layer is higher than a concentration of fluorine in the gate electrode.

According to an exemplary embodiment of the present inventive concepts, a fabricating method of an image device includes forming a gate insulating layer on a substrate. A first passivation layer containing fluorine is formed on the gate insulating layer. A gate electrode is formed on the first passivation layer. A heat treatment or annealing process is performed to diffuse fluorine in the first passivation layer. A concentration of fluorine, in the gate insulating layer is higher than a concentration of fluorine, in the gate electrode after the performing of the heat treatment or annealing process.

According to an exemplary embodiment of the present inventive concepts, an image device includes a substrate including a plurality of photoelectric conversion layers. A first planarization layer is disposed on a first surface of the substrate. A plurality of color filters is disposed on the first planarization layer. A plurality of grid patterns is located at respective boundaries between the plurality of color filters and is disposed on the first planarization layer. A second planarization layer is disposed on the plurality of color filters. A plurality of microlenses is disposed on the second planarization layer. A plurality of transistors is formed on a second surface of the substrate that faces the first surface of the substrate. Each of the plurality of transistors includes a gate insulating layer disposed on the substrate. A gate electrode is disposed on the gate insulating layer. A spacer is formed on sidewalls of the gate insulating layer and the gate electrode. At least one of the plurality of transistors further includes a first passivation layer containing fluorine disposed between the gate insulating layer and the gate electrode. In the at least one of the plurality of transistors that includes the first passivation layer, a concentration of fluorine in the gate, insulating layer is higher than a concentration of fluorine in the gate electrode.

However, aspects of the present invention are not restricted to the one set forth herein. The above and other aspects of the present inventive concepts will become more apparent to one of ordinary skill in the art to which the present invention pertains by referencing the detailed description of exemplary embodiments provided herein.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF EXEMPLARY EMBODIMENTS

Figure 1:
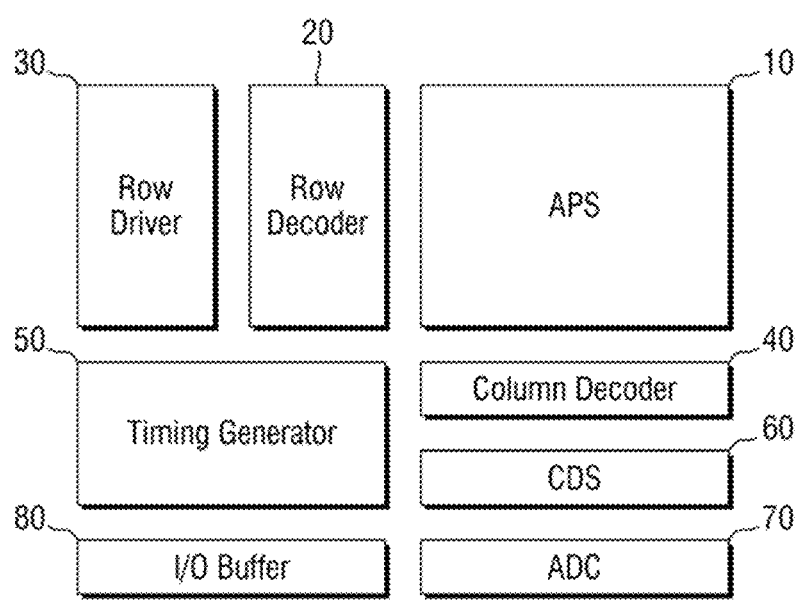
FIG. 1 is a block diagram of an image device according to an exemplary embodiment of the present inventive concepts.

FIG. 1 is an exemplary block diagram of an image device according to an exemplary embodiment of the present inventive concepts.

Referring to FIG. 1, an image device according to an exemplary embodiment of the present inventive concepts may include an active pixel sensor array (APS) 10, a row decoder 20, a row driver 30, a column decoder 40, a timing generator 50, a correlated double sampler (CDS) 60, an analog-to-digital converter (ADC) 70, and an input/output (I/O) buffer 80.

The APS 10 may include a plurality of unit pixels arranged two-dimensionally and may convert an optical signal into an electrical signal. The APS 10 may be driven by driving signals such as a pixel selection signal, a reset signal, and a charge transfer signal received from the row driver 30. Further, the electrical signal convened by the APS 10 may be provided to the CDS 60.

The row driver 30 may provide the APS 10 with a plurality of driving signals to drive a plurality of unit pixels according to the decoding result of the row decoder 20. In an exemplary embodiment, when the unit pixels are arranged in a matrix, separate driving signals may be provided for each row.

The timing generator 50 may provide a timing signal and a control signal to the row decoder 20 and the column decoder 40.

The CDS 60 may receive the electrical signal generated by the APS 10 and may hold and sample the received signal. For example, in an exemplary embodiment, the CDS 60 may double-sample a certain noise level and a signal level according to the electrical signal, and may output a difference level corresponding to a difference between the noise level and the signal level. However, exemplary embodiments of the present inventive concepts are not limited thereto.

The ADC 70 may convert an analog signal corresponding to the difference level outputted from the cps 60 into a digital signal, and may output the digital signal.

The buffer 80 may latch digital signals, and the latched signals may be sequentially outputted as digital signals to an image signal processor according to the decoding result of the column decoder 40.

Figure 2:
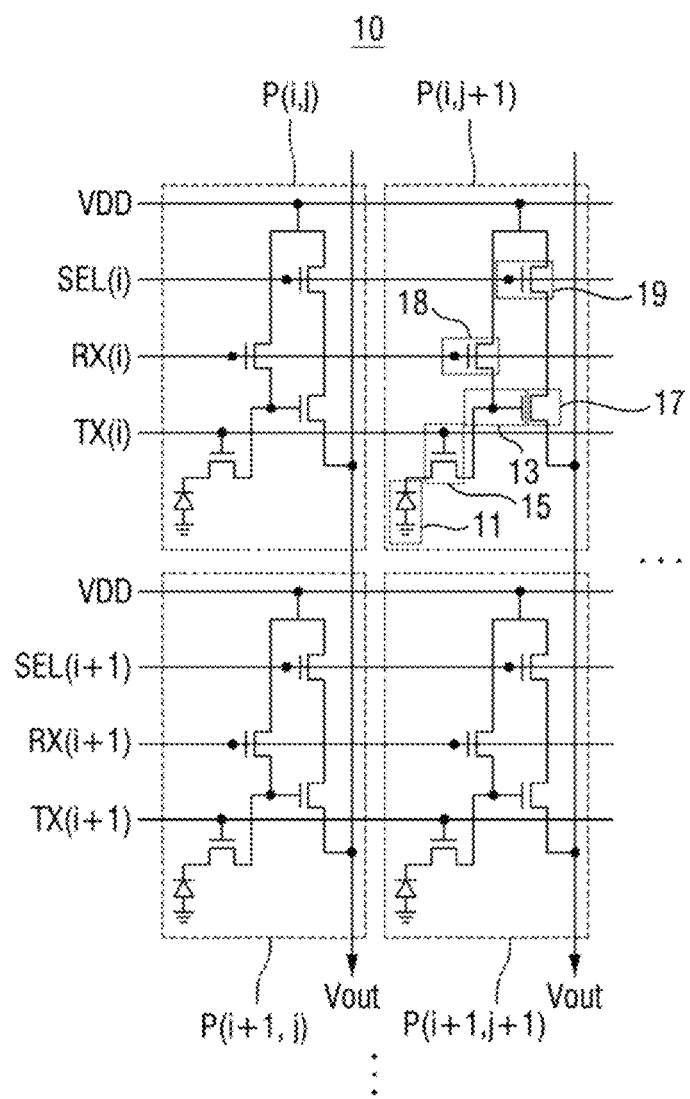
FIG. 2 is an equivalent circuit diagram of an active pixel sensor array in the image device of FIG. 1 according to an exemplary embodiment of the present inventive concepts.

FIG. 2 is an equivalent circuit diagram of an active pixel sensor array in the image device of FIG. 1 according to an exemplary embodiment of the present inventive concepts.

Referring to the exemplary embodiment of FIG. 2, a plurality of pixels P may be arranged in a matrix to form the APS 10 shown in the exemplary embodiment of FIG. 1. Each of the pixels P may include a photoelectric transistor 11, a floating diffusion region 13, a charge transfer transistor 15, a drive transistor 17, a reset transistor 18, and a select transistor 19. Their functions will be described with respect to the pixels P (i, j), P (i, j+1), . . . arranged in the $i^{th}$ row.

The photoelectric transistor 11 may absorb incident light and may accumulate charges corresponding to the quantity of the incident light. In an exemplary embodiment, the photoelectric transistor 11 may be a photodiode, a phototransistor, a photogate, a pinned photodiode, or a combination thereof. In the exemplary embodiment of FIG. 2, a photodiode is illustrated as an example of the photoelectric transistor 11. However, exemplary embodiments of the present inventive concepts are not limited thereto.

Each photoelectric transistor 11 may be coupled with a charge transfer transistor 15 which transfers the accumulated charges to the floating diffusion region 13. The floating diffusion region 13 converts the charges into a voltage, and has a parasitic capacitance so that the charges may be stored cumulatively.

In the exemplary embodiment of FIG. 2, the drive transistor 17 is illustrated as a source follower amplifier. However, exemplary embodiments of the present inventive concepts are not limited thereto. The drive transistor 17 may amplify a change in the electrical potential of the floating diffusion region 13 which receives the charges accumulated in each photoelectric transistor 11 and may output the amplified change in electrical potential signal to an output line Vout.

The reset transistor 18 periodically resets the floating diffusion region 13. In an exemplary embodiment, the reset transistor 18 may be formed of a single MOS transistor which is driven by a bias provided via a reset line RX(i) for applying a predetermined bias (e.g., a reset signal). When the reset transistor 18 is turned on by the bias provided via the reset line RX(i), a predetermined electric potential (e.g., a source voltage VDD) provided to the drain of the reset transistor 18 may be transmitted to the floating diffusion region 13.

The select transistor 19 may serve to select pixels P to be lead on a row basis. The select transistor 19 may be turned on by a bias provided by a row selection line SEL(i). When the select transistor 19 is turned on, a predetermined electric potential (e.g., a source voltage VDD) provided to the drain of the select transistor 19 may be transmitted to the drain region of the drive transistor 17.

A transfer line TX(i) for applying a bias to the charge transfer transistor 15, the reset line RX(i) for applying a bias to the reset transistor 18, and the selection line SEL(i) for applying a bias to the select transistor 19 may be arranged to extend substantially in parallel with each other in a row direction.

Figure 3:
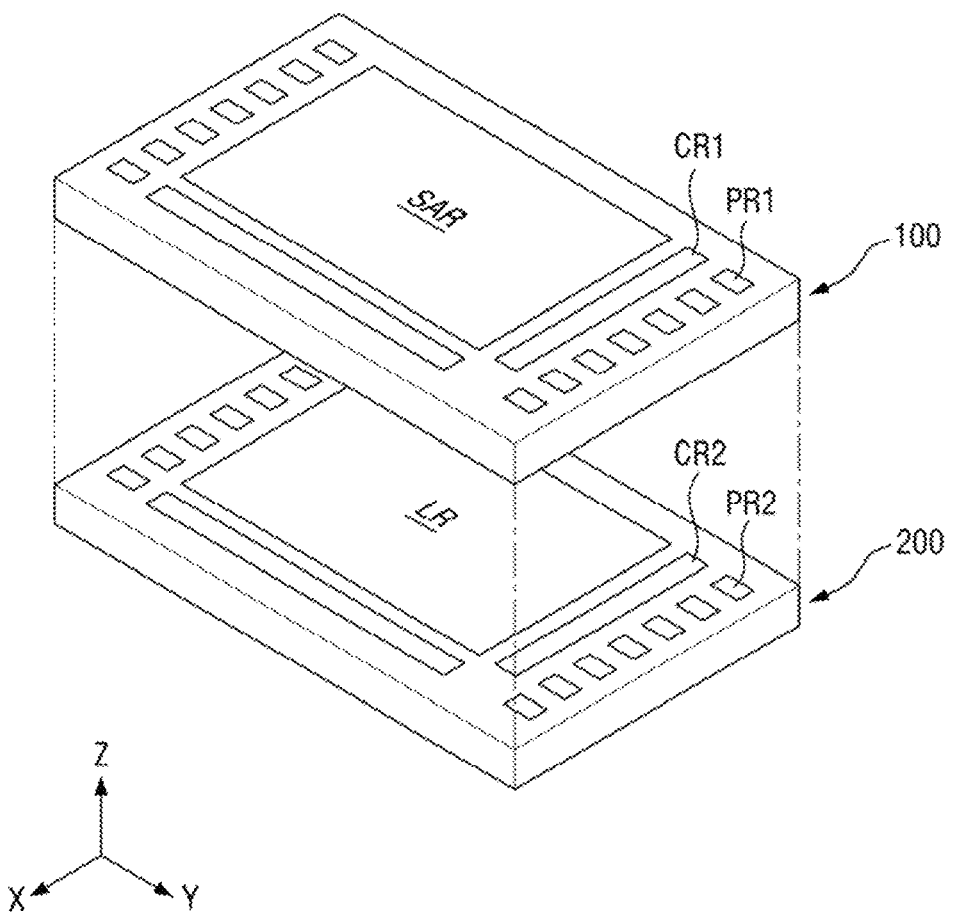
FIG. 3 is a perspective view of an image device according to an exemplary embodiment of the present inventive concepts.

FIG. 3 is a schematic diagram illustrating a layout of an image device according to an exemplary embodiment of the present inventive concepts.

Referring to the exemplary embodiment of FIG. 3, the image device may include a first stacked structure 100 and a second stacked structure 200.

The first stacked structure 100 may be stacked on the second stacked structure 200. For example, as shown in the exemplary embodiment of FIG. 3, the first stacked structure 100 may be stacked on the second stacked structure 200 in a third direction Z (the "Z direction") that is parallel to a thickness direction of the first stacked structure 100. In an exemplary embodiment, the first stacked structure 100 may include a sensor array region SAR, a first connection region SRI and a first pad region PR1.

The sensor array region SAR may include an area corresponding to the APS 10 shown in the exemplary embodiment of FIG. 1. For example, the sensor array region SAR may include a plurality of unit pixels arranged two-dimensionally (e.g., in a matrix in a plane including a first direction X (the "X direction") and a second direction Y (the "Y direction") that are parallel to an upper surface of the first stacked structure 100. In an exemplary embodiment, the X direction and the Y direction are perpendicular to each other. Each of the unit pixels may operate as described with reference to the exemplary embodiment FIG. 2.

The first connection region CR1 may be disposed in the periphery of the sensor array region SAR. For example, as shown in the exemplary embodiment of FIG. 3, the sensor array region SAR has a substantially rectangular shape and the first connection region CR1 may be disposed adjacent an edge (e.g., a right edge) of the sensor array region SAR in the Y direction and an edge (e.g., a lower edge) of the sensor array region SAR in the X direction. However, exemplary embodiments of the present inventive concepts are not limited thereto and the shapes and orientation of the sensor array region SAR and the first connection region CR1 may vary in other exemplary embodiments. The first connection region CR1 may electrically connect the sensor array region SAR of the first stacked structure 100 to the second stacked structure 200.

The first pad region PR1 may be disposed in the periphery of the sensor array region SAR. For example, as shown in the exemplary embodiment of FIG. 3, the first pad region PR1 may be disposed adjacent to the first connection region CR1 (e.g., adjacent in the Y direction) and adjacent to an edge (e.g., a left edge) of the sensor array region in the Y direction. A conductive pad may be formed in the first pad region PR1. In an exemplary embodiment, the conductive pad may be connected to an external device or the like to transmit or receive an electrical signal between the external device and the image device.

The arrangements of the first connection region CR1 and the first pad region PR1 shown in the exemplary embodiment of FIG. 3 are merely examples, and exemplary embodiments of the present inventive concepts are not limited thereto.

As shown in the exemplary embodiment of FIG. 3, the second stacked structure 200 may include a logic circuit region LR, a second connection region CR2, and a second pad region PR2. The second connection region CR2 and the second pad region PR2 of the second stacked structure 200 may overlap (e.g., in the Z direction) the first connection region CR1 and the first pad region PR1 of the first stacked structure 100.

A plurality of electronic elements may be formed in the logic circuit region LR. In an exemplary embodiment, the electronic elements may include a transistor. However, exemplary embodiments of the present inventive concepts are not limited thereto. The logic circuit region LR may be electrically connected to the sensor array region SAR to transmit and receive an electrical signal with each of the unit pixels in the sensor array region SAR. For example, the logic circuit region LR may include areas corresponding to the row decoder 20, the row driver 30, the column decoder 40, the timing generator 50, the CDS 60, the ADC 70 and the I/O buffer 80 as shown in the exemplary embodiment of FIG. 1.

The second connection region CR2 may be disposed in the periphery of the logic circuit region LR. For example, as shown in the exemplary embodiment of FIG. 3, the second connection region may be disposed adjacent an edge (e.g., a right edge) of the logic circuit region LR in the Y direction and an edge (e.g., a lower edge) of the logic circuit region LR in the X direction). However, exemplary embodiments of the present inventive concepts are not limited thereto. The second connection region CR2 may electrically connect the logic circuit region LR of the second stacked structure 200 to the first stacked structure 100. Accordingly, the sensor array region SAR may be electrically connected to the to is circuit re con LR to transmit and receive an electrical signal. The second connection region CR2 may be formed in an area of the second stacked structure 200 to correspond (e.g., overlap in the Z direction) to the first connection region CR1. However, exemplary embodiments of the present inventive concepts are not limited thereto.

The second pad region PR2 may be disposed in the periphery of the logic circuit region LR. For example, as shown in the exemplary embodiment of FRI. 3, the second pad region PR2 may be disposed adjacent to the second connection region CR2 (e.g., adjacent in the Y direction) and adjacent an edge (e.g., a left edge) of the logic circuit region LR in the Y direction. The second pad region PR2 may be electrically connected to the first pad region PR1. The second pad region PR2 may be formed in an area of the second stacked structure 200 to correspond (e.g., overlap in the Z direction) to the first pad region PR1. However, exemplary embodiments of the present inventive concepts are not limited thereto.

Figure 4:
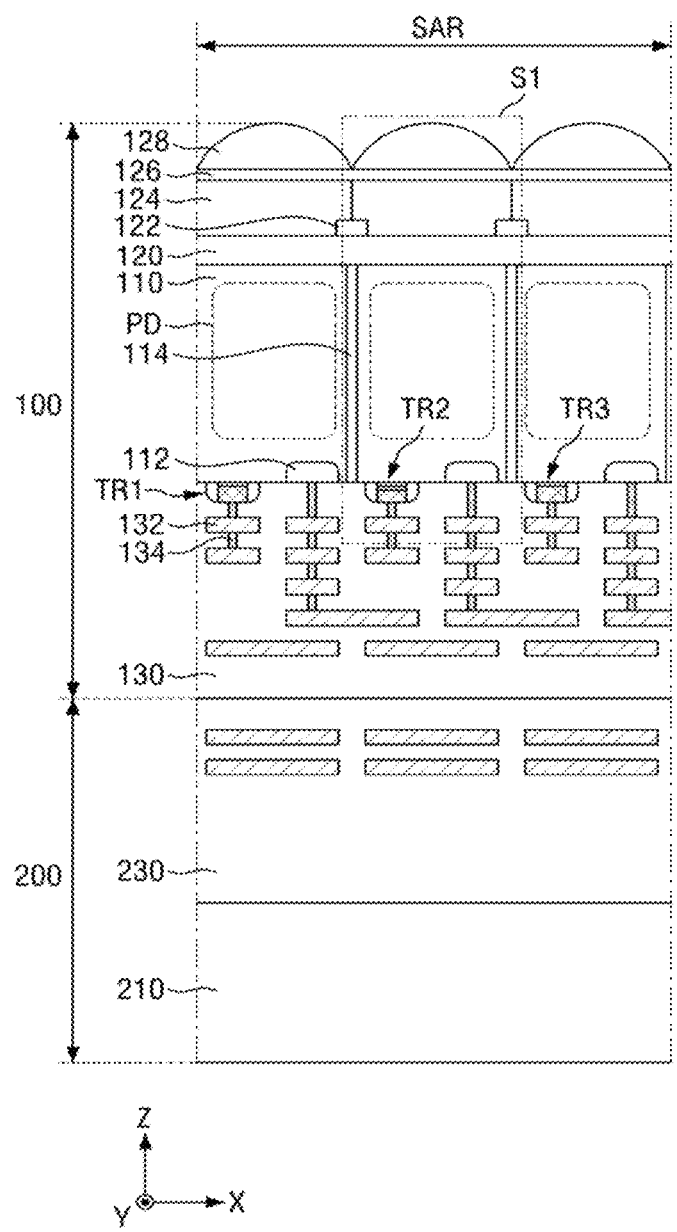
FIG. 4 is a cross-sectional view of an image device according to an exemplary embodiment of the present inventive concepts.
Figure 5:
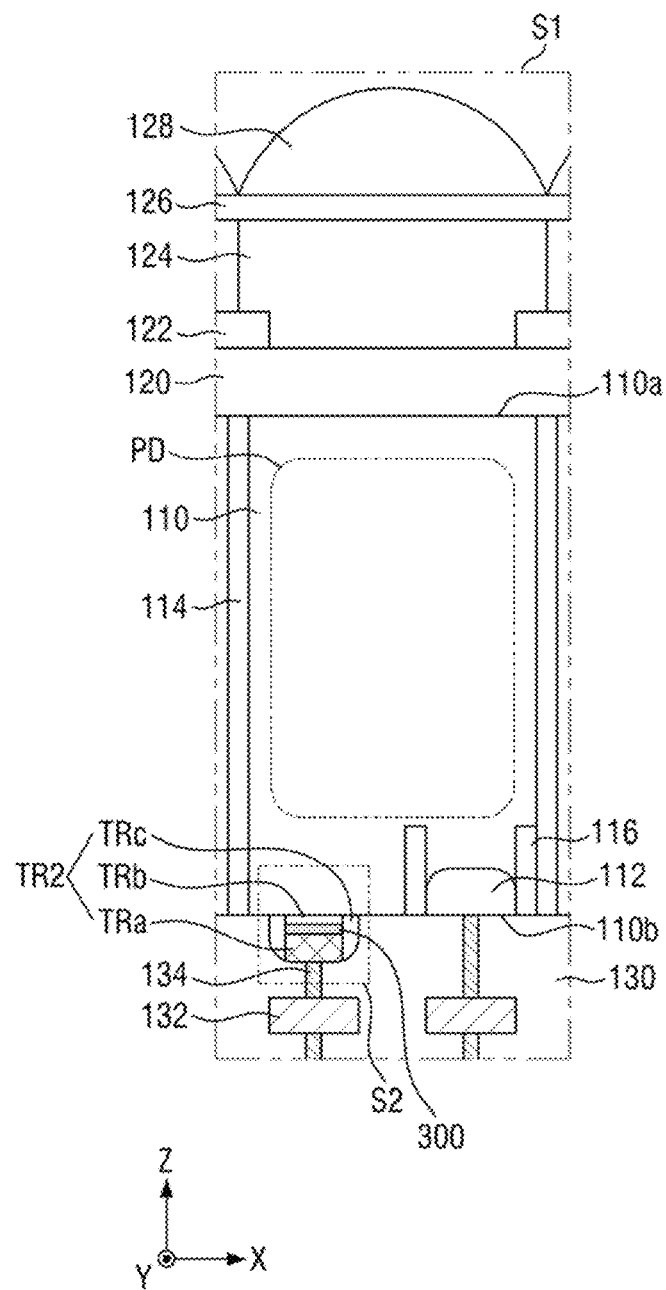
FIG. 5 is an enlarged cross-sectional view of region S1 shown in FIG. 4 according to an exemplary embodiment of the present inventive concepts.

FIG. 4 is a cross-sectional view illustrating an image device according to an exemplary embodiment of the present inventive concepts. FIG. 5 is an enlarged view of a region S1 shown in FIG. 4 according to an exemplary embodiment of the present inventive concepts.

The cross-sectional view of FIG. 4 illustrating the image device in accordance with an exemplary embodiment of the present inventive concepts may be a cross-sectional view of the sensor array region SAR of FIG. 3 taken along the X direction or taken along the Y direction.

Referring to the exemplary embodiments of FIGS. 4 and 5, the image device in accordance with an exemplary embodiment may include the first stacked structure 100 and the second stacked structure 200.

In an exemplary embodiment, the first stacked structure 100 may include a substrate 110 and a first insulating structure 130. In an exemplary embodiment, the second stacked structure 200 may include a logic substrate 210 and a second insulating structure 230. The sensor array region SAR of the first stacked structure 100 may correspond to the sensor array region SAR of the exemplary embodiment of FIG. 3.

The substrate 110 may include a first surface 110a and a second surface 110b opposite to each other. For example, as shown in the exemplary embodiments of FIGS. 4-5, the first surface 110a may be an upper surface (e.g., in the Z direction) of the substrate 110 and the second surface 110b may be a lower surface (e.g., in the Z direction) of the substrate 110. In an exemplary embodiment, the first surface 110a of the substrate 110 may be a light receiving surface on which light is incident. In an exemplary embodiment, the substrate 110 may be a semiconductor substrate. For example, the substrate 110 may be a bulk silicon or silicon-on-insulator (SOI) substrate. The substrate 110 may be a silicon substrate, or may include other materials such as at least one compound selected from silicon germanium, indium antimonide, lead tellurium compound, indium arsenide, indium phosphide, gallium arsenide, and antimonide. Alternatively, the substrate 110 may have an epitaxial layer formed on a base substrate.

The substrate 110 in the sensor array region SAR may form a plurality of unit pixels. For example, each unit pixel may include a photoelectric conversion layer PD, an active region 112, one transistor selected from a first transistor TR1, a second transistor TR2 and a third transistor TR3, a first element isolation film 114, a second element isolation film 116, and a first planarization layer 120, a color filter 124, a grid pattern 122, a second planarization layer 126, and a microlens 128.

The photoelectric conversion layer PD may be formed in the substrate 110 (e.g., between the first surface 110a and the second surface 110b in the Z direction) in the sensor array region SAR. The photoelectric conversion layer PD may generate charges in proportion to an amount of light incident from the outside.

In an exemplary embodiment, the photoelectric conversion layer PD may include a photodiode a phototransistor, a photogate, a pinned photodiode, an organic photodiode, quantum dots, and combinations thereof. However, exemplary embodiments of the present inventive concepts are not limited thereto.

The active region 112 may be formed in the substrate 110 under the second surface 110b. The active region 112 may be formed, for example, by doping impurities in the substrate 110. The active region 112 may form various active regions of each unit pixel. For example, the active region 112 may form the floating diffusion region 13 or the source/drain regions of the charge transfer transistor 15, the drive transistor 17, the reset transistor 18 and the select transistor 19 described with reference to the exemplary embodiment of FIG. 2.

The first, second and third transistors TR1, TR2, TR3 may be formed on the second surface 110b of the substrate 110. The first transistor TR1, the second transistor TR2, and the third transistor TR3 may be referred to as a first active region, a second active region, and a third active region, respectively.

Each of the first to third transistors TR1 to TR3 may be connected to the photoelectric conversion layer PD to form various transistors for processing an electrical signal. For example, the first to third transistors TR1 to TR3 may form the charge transfer transistor 15, the drive transistor 17, the reset transistor 18 and the select transistor 19 described with reference to the exemplary embodiment of FIG. 2. In the present drawings, the first to third transistors TR1 to TR3 are shown as a planar transistor for convenience of illustration. However, exemplary embodiments of the present inventive concepts are not limited thereto. For example, in another exemplary embodiment, at least one of the first to third transistors TR1 to TR3 may be configured as a recess channel array transistor (RCAT) as will be described with reference to the exemplary embodiment of FIG. 7. Further, although a gate electrode capping layer is not illustrated on a gate electrode TRa in the present drawings, a gate electrode capping layer 400 may be formed as shown in the exemplary embodiments of FIGS. 6 and 7 which will be described later.

In an exemplary embodiment, each of the first to third transistors TR1 to TR3 may be a MOS transistor. For example, as shown in the exemplary embodiment of FIG. 5, each of the first to third transistors TR1 to TR3 may include the gate electrode TRa, a gate insulating layer TRb, and a gate spacer TRc. The gate insulating layer TRb may be interposed between the gate electrode TRa and the substrate 110 (e.g., in the Z direction). The gate spacer TRc may extend alongside lateral surfaces (e.g., sidewalls) of the gate electrode TRa, the gate insulating lays TRb, and a first passivation layer 300 and an upper surface of the gate spacer TRc may directly contact the second surface 110b.

The first element isolation film 114 may define each unit pixel in the sensor array region SAR. For example, the first element isolation film 114 may be formed to surround each unit pixel (e.g., in the X direction). In an exemplary embodiment, the first element isolation film 114 may be formed by filling an insulating material in a deep trench formed by patterning the substrate 110. For example, the first element isolation film 114 may extend (e.g., in the Z direction) from the first surface 110a to the second surface 110b. While the first element isolation film 114 in the exemplary embodiment of FIG. 5 has a constant width (e.g., length in the X direction), depending on a patterning process, the first element isolation film 114 may have a shape in which the width of the first element isolation film 114 changes along the Z direction from the first surface 110a to the second surface 110b.

In an exemplary embodiment, the first element isolation film 114 may include an insulating material having a lower refractive index than the substrate 110. For example, in an exemplary embodiment in which the substrate 110 is formed of silicon, the first element isolation film 114 may be a silicon oxide film, a silicon nitride film, an undoped polysilicon film, air, or a combination thereof. Accordingly, the first element isolation film 114 may refract incident light which is obliquely incident on the photoelectric conversion layer PD. Further, the first element isolation film 114 may prevent charges generated in a specific unit pixel by incident light from moving to adjacent pixel regions by random drift. For example, the first element isolation film 114 may improve a light reception rate of the photoelectric conversion layer PD to improve the quality of image data.

The second element isolation film 116 may define the active region 112 in each unit pixel. For example, the second element isolation film 116 may be formed in the substrate 110 under the second surface 110b. As shown in the exemplary embodiments of FIGS. 4-5, the second element isolation film 116 may be formed on lateral sides of the active region 112 (e.g., in the X direction). The second element isolation film 116 may define a region, where the second element isolation film 116 is not formed, as the active region 112.

In an exemplary embodiment, the second element isolation film 116 may be formed by filling an insulating material in a shallow trench formed by patterning the substrate 110. For example, the depth at which the second element isolation film 116 is formed may be shallower than the depth at which the first element isolation film 114 is formed and the height (e.g., distance from the second surface 110b of the substrate 110) of the upper surface of the second element isolation film 116 may be less than the height of the first element isolation film 114.

The first planarization layer 120 may be disposed on the first surface 110a of the substrate 110. For example, as shown in the exemplary embodiments of FIGS. 4-5, a lower surface of the first planarization layer 120 may directly contact the first surface 110a. The first planarization layer 120 may cover the first surface 110a of the substrate 110. In an exemplary embodiment, the first planarization layer 120 may include an insulating material. For example, the first planarization layer 120 may include silicon oxide. However, exemplary embodiments of the present inventive concepts are not limited thereto.

The color filter 124 may be disposed on the first planarization layer 120 in the sensor array region SAR. For example, as shown in the exemplary embodiments of FIGS. 4-5, a lower surface of the color filter 124 may directly contact an upper surface of the first planarization layer 120. The color filter 124 may be arranged to correspond to each unit pixel. For example, the color filters 124 may be arranged two-dimensionally (e.g., in a matrix) in a plane including the X direction and the Y direction.

In an exemplary embodiment, the color filter 124 may include a color filter of red, green, or blue according to the unit pixel. Further, the color filter 124 may include a yellow filter, a magenta filter, and a cyan filter. Moreover, the color filter 124 may further include a white filter. However, exemplary embodiments of the present inventive concepts are not limited thereto.

The grid pattern 122 may be formed in a lattice shape over the first surface 110a of the substrate 110. For example, as shown in the exemplary embodiments of FIGS. 4-5, the grid pattern 122 may be disposed on the first planarization layer 120 and interposed between the color filters 124. The grid pattern 122 may reflect incident light which is obliquely incident on the substrate 110 to provide more incident light to the photoelectric conversion layer PD.

The second planarization layer 126 may be disposed on the color filter 124. The second planarization layer 126 may cover the color filter 124. For example, as shown in the exemplary embodiments of FIGS. 4-5, a lower surface of the second planarization layer 126 may directly contact an upper surface of the color filter 124. In an exemplary embodiment, the second planarization layer 126 may include an insulating material. For example, the second planarization layer 126 may include silicon oxide. However, exemplary embodiments of the present inventive concepts are not limited thereto.

The microlens 128 may be disposed on the second planarization layer 126. For example, as shown in the exemplary embodiments of FIGS. 4-5 a lower surface of the microlens 128 may directly contact an upper surface of the second planarization layer 126. The microlens 128 may be arranged to correspond to each unit pixel. For example, the microlenses 128 may be arranged two-dimensionally (e.g., in a matrix) in a plane including the X direction and the Y direction.

The microlens 128 may have a convex shape (e.g., in a direction away from the substrate 110) and may have a predetermined radius of curvature. Accordingly, the microlens 128 may collect incident light on the photoelectric conversion layer PD. In an exemplary embodiment, the microlens 128 may include a light transmissive resin. However, exemplary embodiments of the present inventive concepts are not limited thereto.

Each unit pixel in the sensor array region SAR may receive incident light to convert an optical signal into an electrical signal. For example, as shown in the exemplary embodiment of FIG. 2, each unit pixel in the sensor array region SAR may include the photoelectric transistor 11, the charge transfer transistor 15, the floating diffusion region 13, the reset transistor 18, the drive transistor 17 and the select transistor 19.

The first insulating structure 130 may be formed on the second surface 110b of the substrate 110. The first insulating structure 130 may cover the second surface 110b of the substrate 110. However, exemplary embodiments of the present inventive concepts are not limited thereto and in soiree exemplary embodiments, the first insulating structure 130 may be formed of multiple layers.

The first insulating structure 130 may include an insulating material. For example, the first insulating structure 130 may include at least one compound selected from silicon oxide, silicon nitride, silicon oxynitride, and a low-k material having a lower dielectric constant than silicon oxide. However, exemplary embodiments of the present inventive concepts are not limited thereto.

A plurality of conductive layers 132 may be formed in a multilayer structure. Each of the conductive layers 132 may extend along a plane including, e.g., the X direction and the Y direction.

A plurality of vias 134 may connect the conductive layers 132 to each other. Each of the vias 134 may extend along, e.g., the Z direction to electrically connect the conductive layers 132. Each of the plurality of vias 134 may have various pillar shapes such as a cylinder, a truncated cone, a polygonal prism, a truncated polygonal pyramid and the like. However, exemplary embodiments of the present inventive concepts are not limited thereto.

As shown in the exemplary embodiment of FIG. 4, the via 134 may be a gate contact 154, a first source/drain contact 152, and/or a second source/drain contact 156 of the exemplary embodiment of FIG. 7 to be described later.

The conductive layers 132 and the vias 134 may include a conductive material. For example, the conductive layers 132 and the vias 134 may include at least one compound selected from tungsten (W), copper (Cu), aluminum (Al), gold (Au), silver (Ag), and an alloy thereof. However, exemplary embodiments of the present inventive concepts are not limited thereto.

In an exemplary embodiment, in the sensor array region SAR, the pixel regions may be electrically connected to the conductive layers 132 and the vias 134. For example, the active region 112 and/or each of the first to third transistors TR1 to TR3 may be connected to the conductive layer 132 through the via 134. For example, the via 134 may be electrically connected to the active region 112 or the gate electrode TRa of each of the transistors TR1 to TR3.

In this embodiment, a passivation process using fluorine (F) may be performed to remove defects in the gate insulating layer TRb forming each of the first to third transistors TR1 to TR3. In the passivation process using fluorine, fluorine may be ion-implanted onto the gate electrode TRa, in which case fluorine may be difficult to move to the gate insulating layer TRb.

However, in the image device according to an exemplary embodiment of the present inventive concepts, the first passivation layer 300 containing fluorine may be formed on the gate insulating layer TRb of at least a partial portion of the first to third transistors TR1 to TR3. For example, as shown in the exemplary embodiment of FIGS. 4-5, the first passivation layer 300 containing fluorine may be formed on the second transistor TR2. However, exemplary embodiments of the present inventive concepts are not limited thereto. As shown in the exemplary embodiment of FIG. 5, a first surface of the first passivation layer 300 may directly contact the gate electrode TRa and an opposite second surface of the first passivation layer 300 may directly contact the gate insulating layer TRb. The inclusion of the first passivation layer 300 permits fluorine to be efficiently and directly moved into the gate insulating layer TRb without being absorbed by the gate electrode TRa. Hereinafter, the image device according to some exemplary embodiments of the present inventive concepts in which the first passivation layer 300 containing fluorine is formed will be described.

Figure 6:
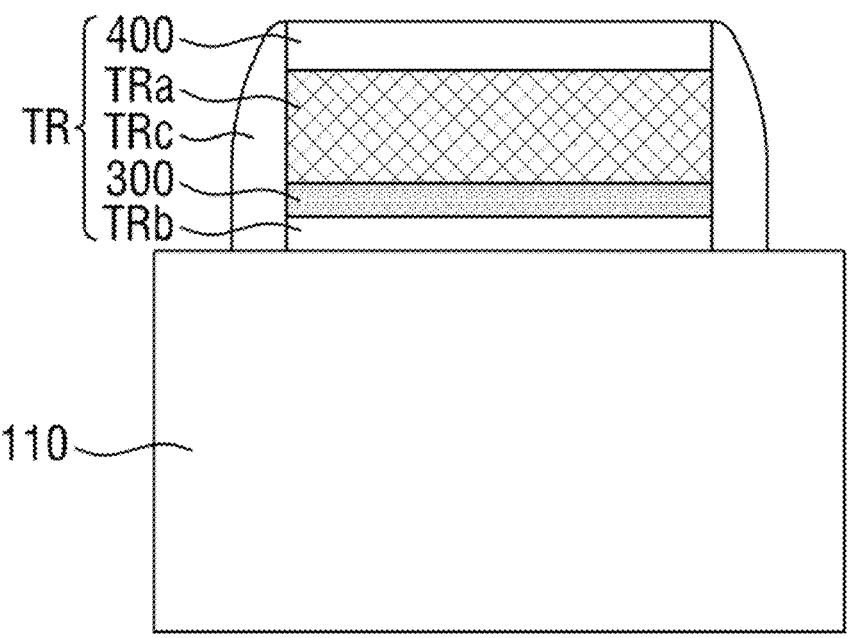
FIG. 6 is an enlarged cross-sectional view of region S2 shown in FIG. 5 according to an exemplary embodiment of the present inventive concepts.

FIG. 6 is an enlarged cross-sectional view of region S2 of FIG. 5 according to an exemplary embodiment of the present inventive concepts. FIG. 7 is an enlarged cross-sectional view of the region S2 of FIG. 5 according to another exemplary embodiment of the present inventive concepts. FIG. 8 is an exemplary diagram explaining a conventional passivation process for an image device which does not include the first passivation layer 300 as shown in FIG. 5. The exemplary embodiments of FIGS. 9 to 12 are enlarged views of a region S3 of the image device of FIG. 7 according to exemplary embodiments of the present inventive concepts.

In the exemplary embodiment of FIG. 5, each of the first to third transistors TR1 to TR3 is shown as a planar transistor for simplicity of illustration, and the gate electrode capping layer is omitted. However, as shown in the exemplary embodiment of FIG. 6, the first to third transistors TR1 to TR3 may include the capping layer 400. For example, the capping layer 400 may be disposed directly on the gate electrode TRa. Further, as shown in the exemplary embodiment FIG. 7, the first to third transistors TR1 to TR3 may be configured as a recess channel array transistor (RCAT) and may include the capping layer 400. In the exemplary embodiment of FIG. 7, the capping layer 400 is disposed directly on the first gate electrode TR'aa. Hereinafter, the image device according to some exemplary embodiments of the present inventive concepts will be described with respect to a structure of a planar transistor TR as shown in FIG. 6 and a structure of an RCAT TR' as shown in FIG. 7. However, the structure of the first to third transistors T1 to T3 of the image device according to exemplary embodiments of the present inventive concepts are not limited to the planar transistor and the RCAT.

Referring to FIG. 6, the image device according to an exemplary embodiment of the present inventive concepts may include the substrate 110 and the transistor TR. In the following description, the transistor TR is assumed as a drive transistor TR for convenience of explanation. However, exemplary embodiments of the present inventive concepts are not limited thereto. Further, for simplicity of description, a description of the source/drain and the contacts is omitted.

In an exemplary embodiment, the substrate 110 may be, for example, a bulk silicon or silicon-on-insulator (SOI) substrate. Alternatively, the substrate 110 may be a silicon substrate, or may include other materials such as at least one compound selected from silicon germanium, indium antimonide, lead tellurium compound, indium arsenide, indium phosphide, gallium arsenide, and gallium antimonide. Alternatively, the substrate 110 may have an epitaxial layer formed on a base substrate.

The drive transistor TR may be disposed on the substrate 110. The drive transistor TR may include the gate insulating layer TRb disposed on the substrate 110. For example, as shown in the exemplary embodiment of FIG. 6, the gate insulating layer TRb may be disposed directly on the substrate 110. In an exemplary embodiment, the gate insulating layer TRb may include silicon oxide. The gate insulating layer TRb may be formed through an in-situ steam generation (ISSG) process. However, exemplary embodiments of the present inventive concepts are not limited thereto.

The first passivation layer 300 may be formed along the gate insulating layer TRb. For example, as shown in the exemplary embodiment of FIG. 6, the first passivation layer 300 may be disposed directly on the gate insulating layer TRb. While the thickness (e.g., length in the Z direction) of the first passivation layer 300 shown in the exemplary embodiment of FIG. 6 is substantially the same as the thickness of the gate insulating layer TRb, exemplary embodiments of the present inventive concepts are not limited thereto. For example, in other exemplary embodiments, the thickness of the first passivation layer 300 may be different from the thickness of the gate insulating layer TRb.

In FIG. 6, a channel region (FIG. 16) disposed between the substrate 110 and the gate insulating layer TRb is omitted for simplicity of illustration.

The first passivation layer 300 contains fluorine, and thus, the fluorine contained in the first passivation layer 300 may move to the gate insulating layer TRb through a heat treatment process or an annealing process that is performed during a fabrication process of the drive transistor TR.

Accordingly, the fluorine contained in the first passivation layer 300 minimizes the loss during the process of moving to the gate insulating layer TRb, and compensates the defects of the gate insulating layer TRb to a maximum extent. For example, the gate insulating layer TRb may receive fluorine from the first passivation layer 300 and may partially include fluorine that is not bonded to the defects of the gate insulating layer TRb.

Figure 7:
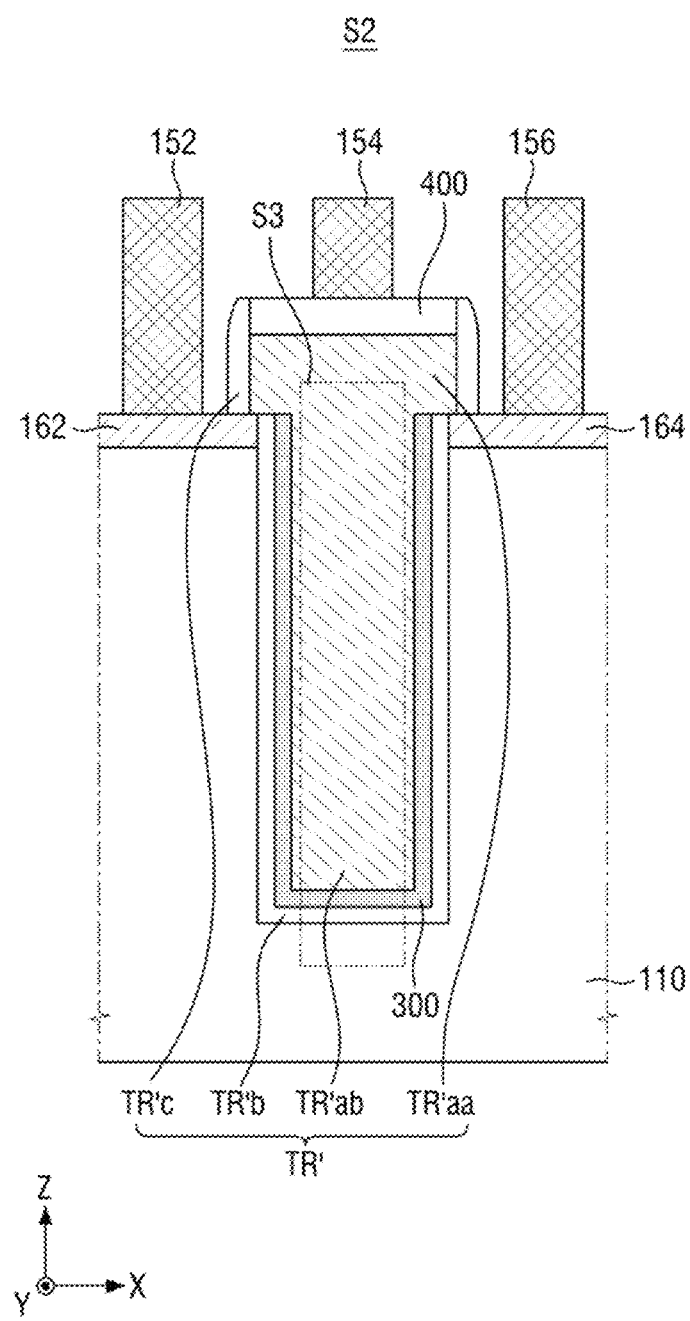
FIG. 7 is an enlarged cross-sectional view of region S2 shown in FIG. 5 according to another exemplary embodiment of the present inventive concepts.
Figure 8:
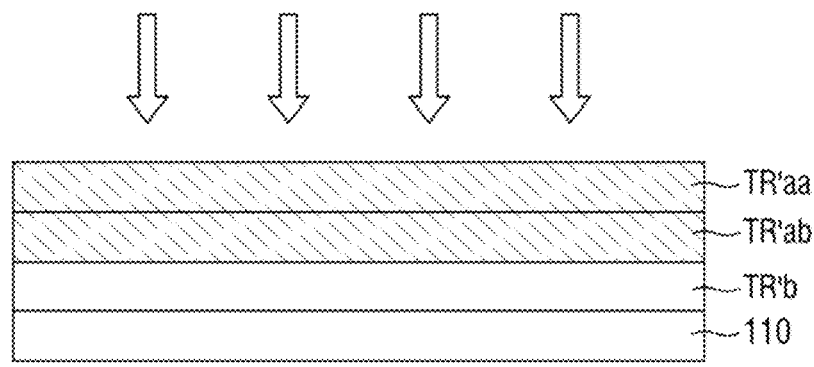
FIG. 8 is a cross-sectional view explaining a conventional passivation process for an image device which does not include the first passivation layer.
Figure 8:
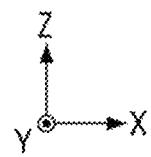

Referring to the exemplary embodiment of FIG. 7, an imaging device may include a substrate 110, a transistor TR', first and second source/drain regions 162 and 164, and first and second source/drain contacts 152 and 156, and a gate contact 154. In the following description, the transistor TR' is assumed to be a drive transistor TR'. However, exemplary embodiments of the present inventive concepts are not limited thereto.

In an exemplary embodiment, the substrate 110 may be a bulk silicon or silicon-on-insulator (SOI) substrate. Alternatively, the substrate 110 may be a silicon substrate, or may include other materials such as at least one compound selected from silicon germanium, indium antimonide, lead tellurium compound, indium arsenide, indium phosphide, gallium arsenide, or gallium antimonide. Alternatively, the substrate 110 may have an epitaxial layer formed on a base substrate. However, exemplary embodiments of the present inventive concepts, are not limited thereto.

The drive transistor TR' may be disposed on the substrate 110. The drive transistor TR' may include a gate insulating layer TR'b formed along the sidewall of a recess formed in the substrate 110 in a depth direction and on a bottom of the recess. In an exemplary embodiment, the gate insulating layer TR'b may include silicon oxide. The gate insulating layer TR'b may be formed through an ISSG process.

The first passivation layer 300 may be disposed on the gate insulating layer TR'b. For example, as shown in the exemplary embodiment of FIG. 7, the first passivation layer 300 may be disposed directly on the gate insulating layer TR'b. The exemplary embodiment of FIG. 7 shows the thickness of the first passivation layer 300 as being substantially the same as the thickness of the gate insulating layer TR'b. However, exemplary embodiments of the present inventive concepts are not limited thereto. For example, in other exemplary embodiments, the thickness of the first passivation layer 300 may be different from the thickness of the gate insulating layer TR'b.

In FIG. 7, a channel region TR'ch (FIG. 16) disposed between the substrate 110 and the gate insulating layer TRb is omitted for simplicity of illustration.

The first passivation layer 300 contains fluorine, and thus, the fluorine contained in the first passivation layer 300 may move to the gate insulating layer TR'b through a heat treatment process or an annealing process that is performed during a fabrication process of the drive transistor TR'.

Accordingly, the fluorine contained in the first passivation layer 300 minimises the loss dining the process of moving to the gale insulating layer TR'b, and compensates the defects of the gate insulating layer TR'b to a maximum extent. For example, the gate insulating layer TR'b may receive fluorine from the first passivation layer 300 and may partially include fluorine that is not bonded to the defects of the gate insulating layer TR'b.

The first passivation layer 300 containing fluorine will be described in detail with reference to the exemplary embodiments of FIGS. 8 to 12.

FIGS. 8 to 12 are partially enlarged views of region S3 of FIG. 7. However, for simplicity of description, the thicknesses of a first gate electrode TR'aa, a second gate electrode TR'ab, the first passivation layer 300, a gate insulating layer TR'b and the substrate 110 in the Z direction are scaled and illustrated in FIGS. 8 to 12.

Referring to the exemplary embodiment of FIG. 8, a conventional passivation process without the first passivation layer 300 of FIGS. 4-7 are shown.

The gate insulating layer TR'b on the substrate 110 may include defects that are inevitably generated in the fabrication process. Therefore, in order to remove the defects of the gate insulating layer TR'b, after the first and second gate electrodes TR'aa and TR'ab are formed on the gate insulating layer TR'b, fluorine may be ion-implanted.

However, the ion-implanted fluorine may be used to remove defects present in the first gate electrode TR'aa and/or second gate electrode TR'ab while passing therethrough. For example, a portion of the ion-implanted fluorine may be captured by the first gate electrode TR'aa and/or second gate electrode TR'ab, and accordingly the fluorine implanted into the gate insulating layer TR'b may be reduced. Therefore, only a partial portion of the fluorine implanted to remove the defects of the gate insulating layer TR'b may move to the gate insulating layer TR'b, thereby deteriorating the structural quality of the gate insulating layer TR'b of the drive transistor included in the image device.

However, exemplary embodiments of the present inventive concepts include the first passivation layer 300 containing fluorine disposed on the gate insulating layer TR'b. Hereinafter, the image device according to exemplary embodiments of the present inventive concepts in which defects of the gate insulating layer TR'b are removed by using the passivation layer containing fluorine will be described with reference to FIGS. 9 to 12.

Figure 9:
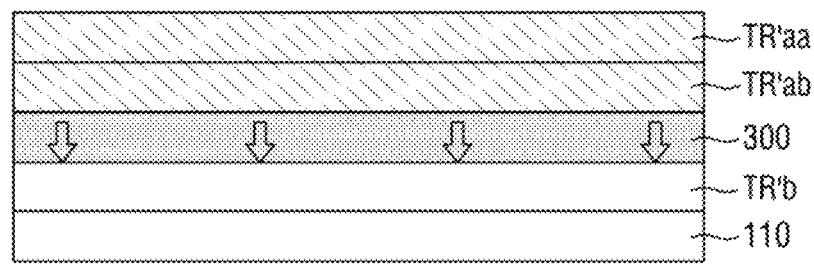
FIGS. 9 to 12 are enlarged cross-sectional views of a region S3 shown in FIG. 7 according to exemplary embodiments of the present inventive concepts.
Figure 9:
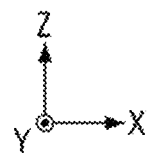

Referring to the exemplary embodiment of FIG. 9, the first passivation layer 300 may be disposed on the gate insulating layer TR'b. For example, as shown in the exemplary embodiment of FIG. 9, the first passivation layer 300 may be disposed directly on the gate insulating layer TR'b.

The first passivation layer 300 according to some exemplary embodiments may contain fluorine. For example, since fluorine is already contained in the first passivation layer 300, it is unnecessary to implant fluorine through an ion implantation process, and thus the fabrication process can be simplified.

Fluorine contained in the first passivation layer 300 may be diffused into the gate insulating layer TR'b during the heat treatment process or the annealing process that is performed in the fabrication process of the image device according to some exemplary embodiments of the present inventive concepts. For example, since there is no layer to capture fluorine disposed between the first passivation layer 300 and the gate insulating layer TR'b, fluorine present in the first passivation layer 300 is effectively diffused into the gate insulating layer TR'b. Therefore, defects are minimized, and the structural, quality of the gate insulating layer TR'b of the drive transistor of the image device is improved. The concentration of fluorine in the gate insulating layer TR'b may be higher than the concentration of fluorine in the gate electrode TR'a (e.g., after the heat treatment process or annealing process is performed).

Figure 10:
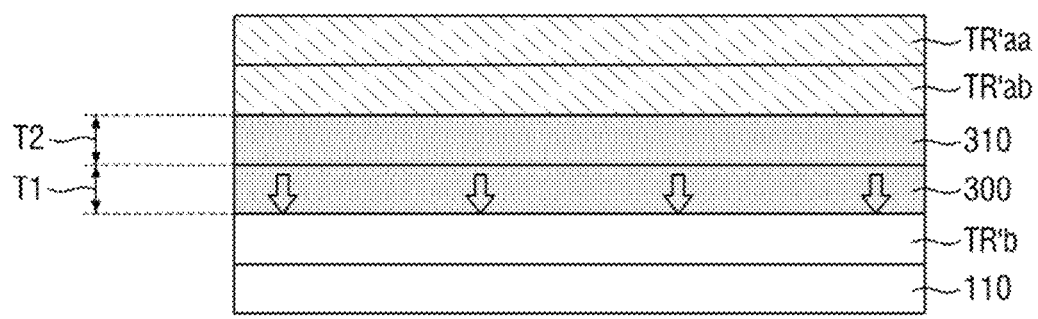

With reference to the exemplary embodiment of FIG. 10, a description overlapping with the above description for the same structural features is omitted for convenience of explanation.

Referring to the exemplary embodiment of FIG. 10, a second passivation layer 310 may be formed on the first passivation layer 300. For example, the second passivation layer 310 may be formed directly on the first passivation layer 300.

In an exemplary embodiment, the second passivation layer 310 may contain fluorine. Further, the first passivation layer 300 may contain fluorine at a first concentration and the second passivation layer 310 may contain fluorine at a second concentration. In an exemplary embodiment, the first concentration and the second concentration may be the same. However, exemplary embodiments of the present inventive concepts are not limited thereto and in other exemplary embodiments, the first concentration of fluorine contained in the first passivation layer 300 and the second concentration of fluorine contained in the second passivation layer 310 may be different from each other.

In an exemplary embodiment, the thickness T1 (e.g., length in the Z direction) of the first passivation layer 300 and the thickness T2 of the second passivation layer 310 (e.g., length in the Z direction) may be the same.

In an exemplary embodiment, the first passivation layer 300 may be disposed on the gate insulating layer TR'b, and fluorine contained in the first passivation layer 300 may be directly diffused into the gate insulating layer TR'b, as shown in the exemplary embodiment of

FIG. 9.

In the image device of the exemplary embodiment of FIG. 9, fluorine in the first passivation layer 300 may be diffused into the second gate electrode TR'b during a heat treatment process or the annealing process. However, in the image device of the exemplary embodiment of FIG. 10, the second passivation layer 310 may be additionally stacked on the first passivation layer 300 to ensure a sufficient amount of fluorine for diffusion into the gate insulating layer TR'b. In this exemplary embodiment, defects in the gate insulating layer TR'b of the image device may be further reduced, thereby improving the structural quality of the image device.

In the exemplary embodiment of FIG. 10, the number of stacked passivation layers is illustrated as two. However, exemplary embodiments of the present inventive concepts are not limited thereto and in other exemplary embodiments a plurality of passivation layers including three or more passivation layers may be stacked in the image device. For example, the second passivation layer 310 may include a plurality of stacked passivation layers.

Figure 11:
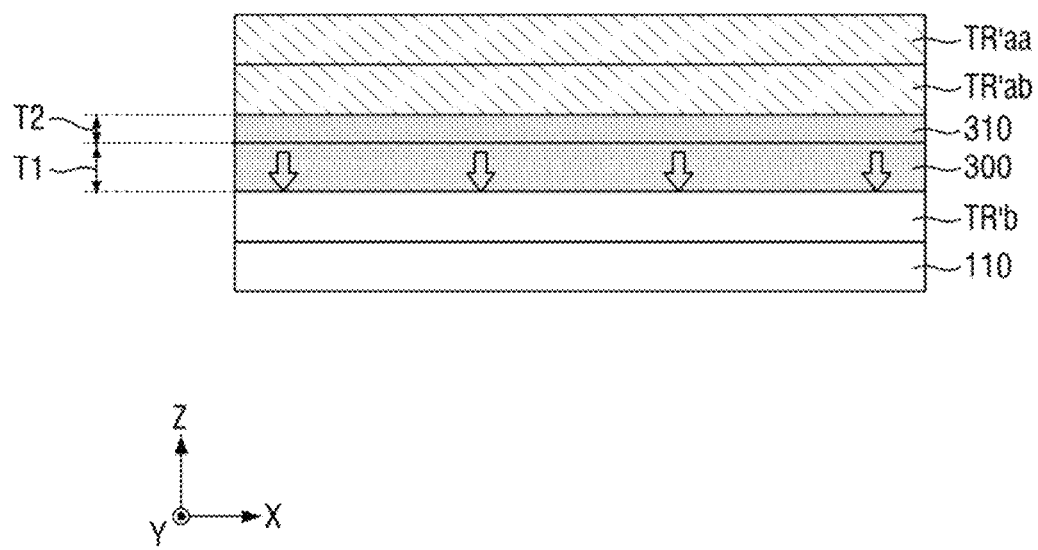

Referring to the exemplary embodiment of FIG. 11, the first passivation layer 300 and the second passivation layer 310 of FIG. 10 may have different thicknesses, unlike the exemplary embodiment of FIG. 10.

For example, the thickness T1 of the first passivation layer 300 (e.g., length in the Z direction) may be greater than the thickness T2 of the second passivation layer 310 (e.g., length in the Z direction). For example, in an exemplary embodiment, the thickness T1 of the first passivation layer 300 may be about twice as large as the thickness T2 of the second passivation layer 310.

In this exemplary embodiment, assuming that the first passivation layer 300 contains fluorine at a first concentration and the second passivation layer 310 contains fluorine at a second concentration, the first concentration and the second concentration may be the same. However, exemplary embodiments of the present inventive concepts are not limited thereto and in other exemplary embodiments the first concentration of fluorine contained in the first passivation layer 300 and the second concentration of fluorine contained in the second passivation layer 310 may be different from each other.

Figure 12:
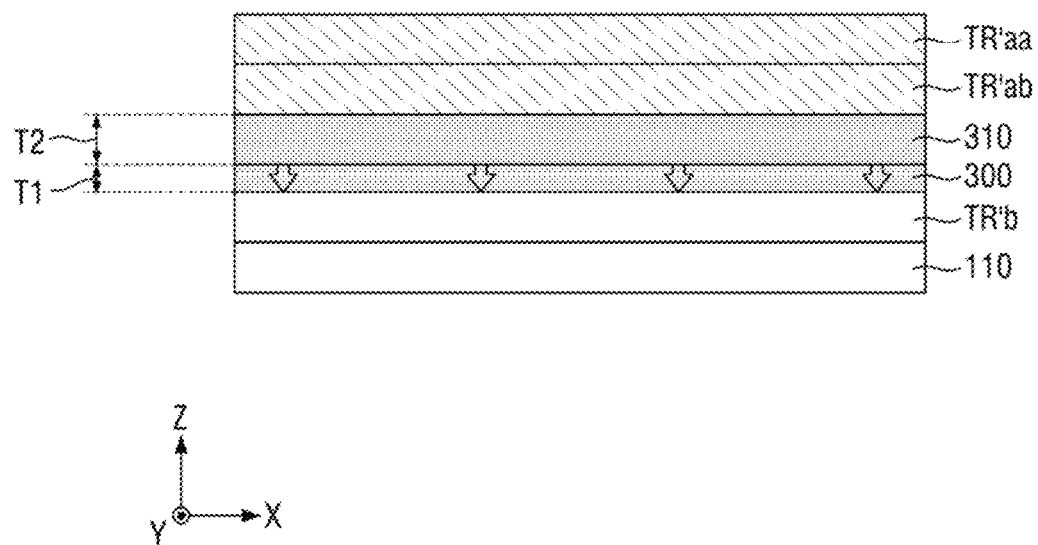
Figure 12:
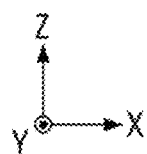

Referring to the exemplary embodiment of FIG. 12, unlike the image device of the exemplary embodiment of FIG. 11, the thickness T2 of the second passivation layer 310 (e.g., length in the third direction Z) may be greater than the thickness T1 of the first passivation layer 300 (e.g., length in the third direction Z). For example, in an exemplary embodiment, the thickness T2 of the second passivation layer 310 may be about twice as large as the thickness T1 of the first passivation layer 300.

In this embodiment, assuming that the first passivation layer 300 contains fluorine at a first concentration and the second passivation layer 310 contains fluorine at a second concentration, the first concentration and the second concentration may be the same. However, exemplary embodiments of the present inventive concepts are not limited thereto and in other exemplary embodiments the first concentration of fluorine contained in the first passivation layer 300 and the second concentration of fluorine contained in the second passivation layer 310 may be different from each other. For example, in an exemplary embodiment the first concentration of fluorine contained in the first passivation layer 300 may be higher than the second concentration of fluorine contained in the second passivation layer 310.

Referring again to the exemplary embodiment of FIG. 7, the first gate electrode TR'aa and the second gate electrode TR'ab may be formed on the first passivation layer 300 therealong. The first gate electrode TR'aa may be a portion protruding from the substrate 110, and the second gate electrode TR'ab may be a portion filling a recess formed in the substrate 110. As shown in the exemplary embodiment of FIG. 7, the width of the first gate electrode TR'aa (e.g., length in the X direction) may be greater than the width of the second gate electrode TR'ab. However, exemplary embodiments of the present inventive concepts are not limited thereto.

The first and second gate electrodes TR'aa and TR'ab may include a conductive material. For example, in an exemplary embodiment the first and second gate electrodes TR'aa and TR'ab may include polysilicon or metal. However, exemplary embodiments of the present inventive concepts are not limited thereto.

The capping layer 400 may be disposed on the first gate electrode TR'aa. For example, as shown in the exemplary embodiment of FIG. 7, the capping layer 400 may be disposed directly on the first gate electrode TR'aa. The capping layer 400 may include an insulating material.

The gate spacer TR'c may be formed on the lateral side surfaces (e.g., sidewalls) of the first gate electrode TR'aa and the capping layer 400. In an exemplary, embodiment, the gate spacer TR'c may include at least one compound selected from silicon oxide, silicon nitride, and sill on oxynitride. However, exemplary embodiments of the present inventive concepts are not limited thereto. Although the exemplary embodiment of FIG. 7 shows the gate spacer TR'c as a single layer in the drawing, exemplary embodiments of the present inventive concepts are not limited thereto. For example, in other exemplary embodiments, the gate spacer TR'c may be a multilayer spacer in which a plurality of lavers are stacked. The shape of the gate spacer TR'c and the shape of the multilayer spacer forming the gate spacer TR'c may be an I shape, an L shape or a combination thereof depending on the fabrication process or application.

The gate contact 154 may be disposed on the capping layer 400. For example, as shown in the exemplary embodiment of FIG. 7, the gate contact 154 may be disposed directly on the capping layer 400.

The first and second source/drain regions 162 and 164 may be thrilled by doping impurities such as P into the silicon layer of the substrate 110.

The first and second source/drain contacts 152 and 156 may be disposed on the first and second source/drain regions 162 and 164. For example, as shown in the exemplary embodiment of FIG. 7, the first and second source/drain contacts 152 and 156 may be disposed directly on the first and second source/drain regions 162 and 164. The first source/drain contact 152 may be disposed on the first source/drain region 162, and the second source/drain contact 156 may be disposed on the second source/drain region 164.

In an exemplary embodiment the top surfaces of the gate contact 134 and the first and second source/drain contacts 152 and 156 may have the same height (e.g., distance from the substrate 110 in the Z direction) which may facilitate connection with the wiring formed on the contacts.

FIGS. 13 to 20 illustrate exemplary intermediate steps of a fabricating method of an image device according to exemplary embodiments of the present inventive concepts. While the exemplary embodiments of FIGS. 13-20 show a fabricating method for a RCAT TR' as shown in FIG. 7, a similar fabricating method may be performed for the planar transistor TR shown in FIG. 6.

Figure 13:
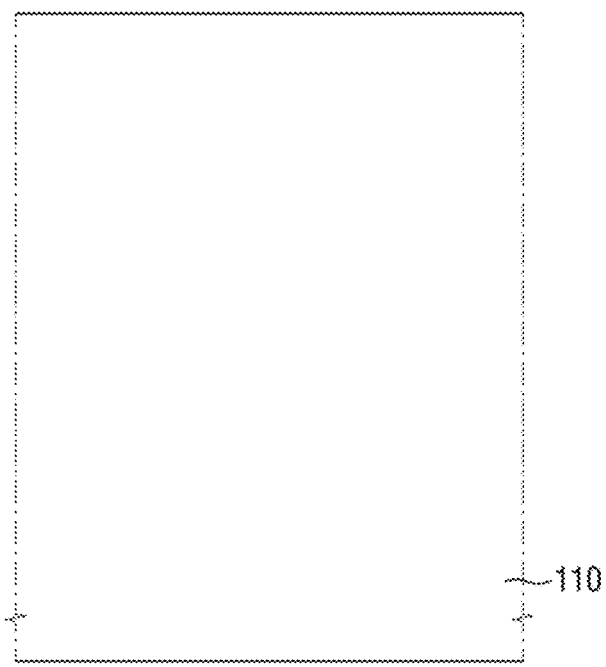
FIGS. 13 to 20 are cross-sectional views illustrating intermediate steps of a fabricating method of an image device according to exemplary embodiments of the present inventive concepts.
Figure 13:
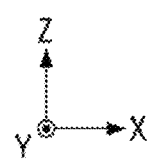

Referring to the exemplary embodiment of FIG. 13, the substrate 110 is provided.

In an exemplary embodiment, the substrate 110 may be, for example, a bulk silicon or silicon-on-insulator (SOI) substrate. Alternatively, the substrate 110 may be a silicon substrate, or may include other materials such as at least one compound selected from silicon germanium, indium antimonide, lead tellurium compound, indium arsenide, indium phosphide, gallium arsenide, and gallium antimonide. Alternatively, the substrate 110 may have an epitaxial layer formed on a base substrate.

Figure 14:
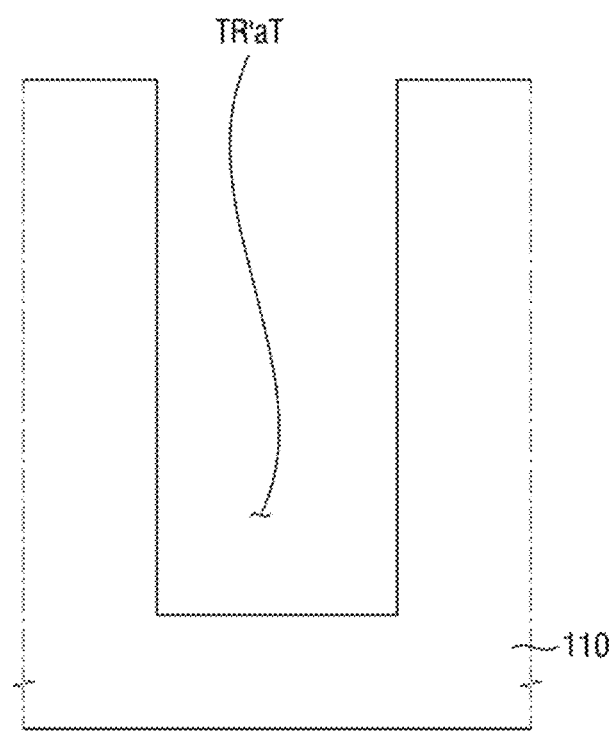

Referring to, the exemplary embodiment of FIG. 14, a recess TR'aT is formed in the substrate 110.

The recess TR'aT may extend in the Y direction. The recess TR'aT may be formed downward in the Z direction of the substrate 110.

In an exemplary embodiment, the recess TR'aT may be formed by wet etching or dry etching. However, exemplary embodiments of the present inventive concepts are not limited thereto.

Figure 15:
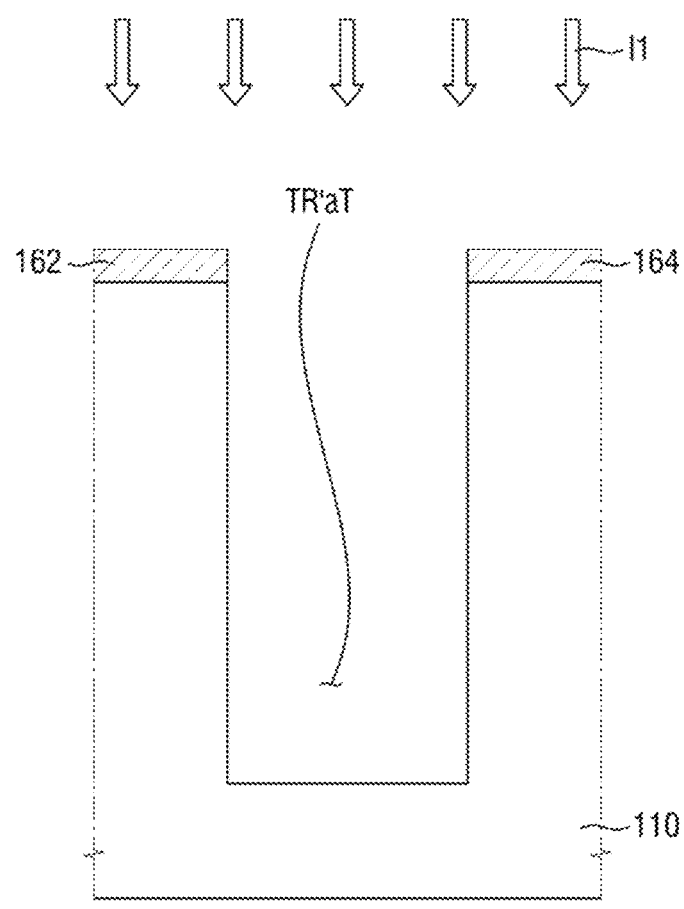

Referring to the exemplary embodiment of FIG. 15, the first and second source/drain regions 162 and 164 may be formed through a first ion implantation process I1.

The first source/drain region 162 may be formed at one lateral side of the recess TR'aT. The second source/drain region 164 may be formed at the other lateral side of the recess TR'aT.

As shown in the exemplary embodiment of FIG. 15, the depths of the bottom surfaces of the first and second source/drain regions 162 and 164 may be shallower than the depth of the recess TR'aT. For example, the height (e.g., length in the Z direction from a bottom surface of the substrate 110) of the bottom surface of the first and second source/drain regions 162 and 164 may be higher than the height of a bottom surface of the recess TR'aT. The first implantation process I1 may be performed on only a partial portion of the top surface of the substrate 110 by a blocking film.

Figure 16:
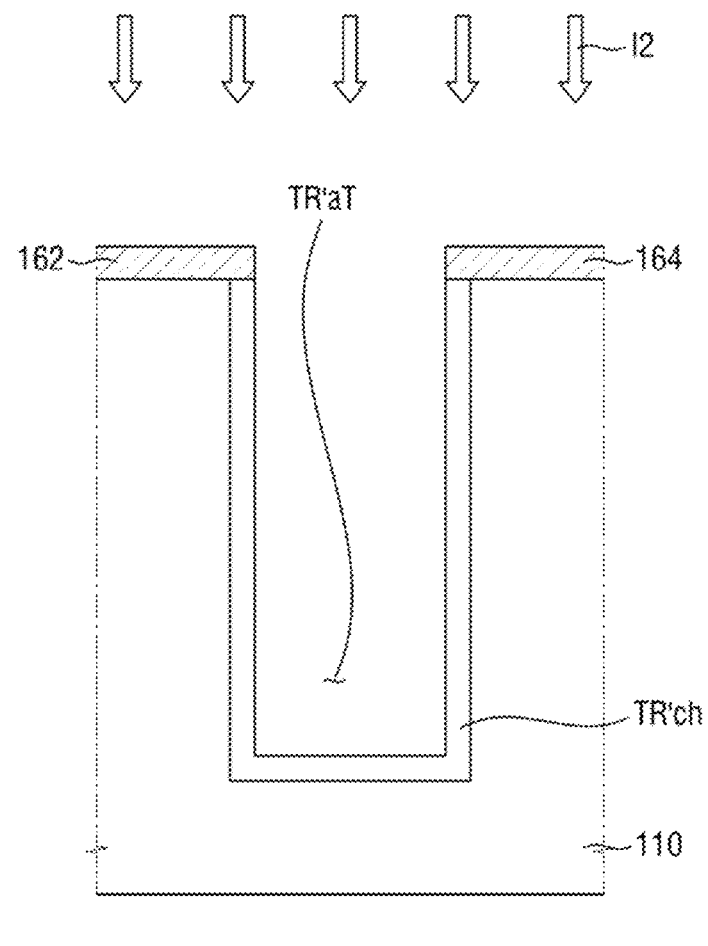

Referring to the exemplary embodiment of FIG. 16, doping of the channel region TR'ch may be performed through a second ion implantation process I2.

The channel region TR'ch may be a region formed on the bottom and side surfaces of the recess TR'aT to a predetermined thickness. The second ion implantation process I2 for the channel region TR'ch may be a process for adjusting a subsequent threshold voltage of the channel region TR'ch.

In this exemplary embodiment, the first ion implantation process I1 and the second ion implantation process I2 may be simultaneously pert need in the same process. For example, while the first and second source/drain regions 162 and 164 are formed, doping of the channel region TR'ch may be performed at the same time.

Alternatively, the first ion implantation process I1 may be performed, and the second ion implantation process I2 different from the first ion implantation process I1 may be performed. The different first ion implantation process I1 and second ion implantation process I2 may be performed at the same time or at different times.

In all drawings except for FIG. 16, the channel region TR'ch is not illustrated for simplicity of illustration.

Figure 17:
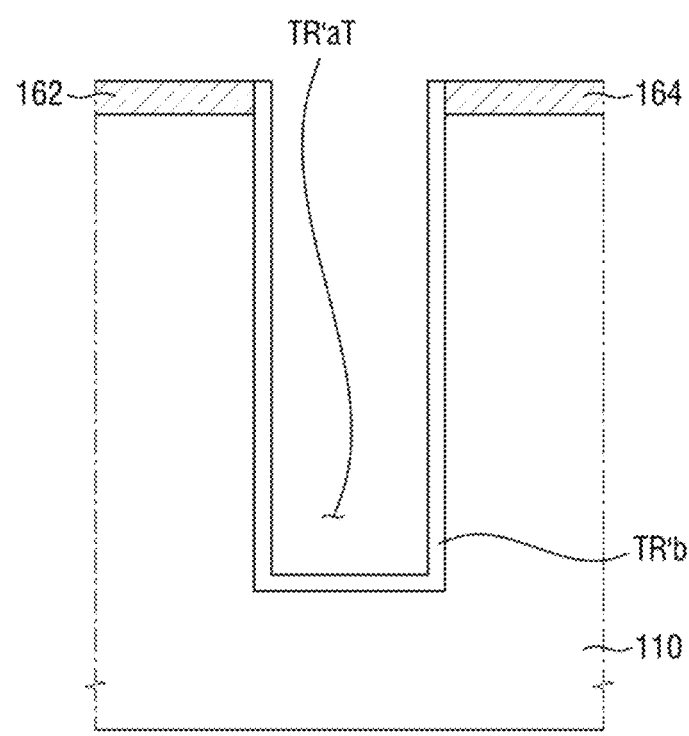

Referring to the exemplary embodiment of FIG. 17, the gate insulating layer TR'b is then formed.

The gate insulating layer TR'b may be formed along the bottom and inner surfaces of the recess TR'aT and the side surfaces of the first and second source/drain regions 162 and 164. The gate insulating layer TR'b may be formed on the channel region TR'ch. The gate insulating layer TR'b may include silicon oxide.

In this exemplary embodiment, the gate insulating layer TR'b may be performed by an ISSG process, a wet oxidation process, a thermal radical oxidation process, or a plasma oxidation process. However, exemplary embodiments of the present inventive concepts are not limited thereto.

Figure 18:
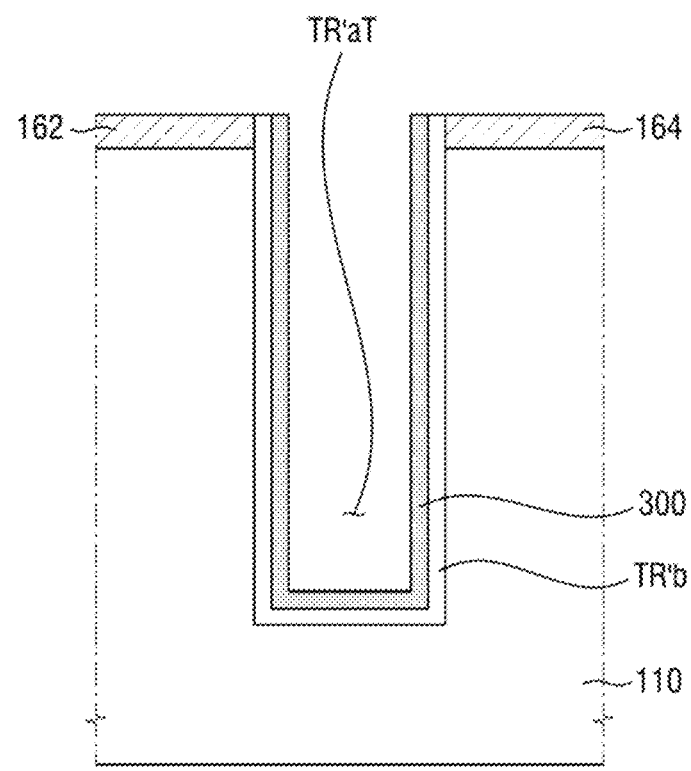

Referring to the exemplary embodiment of FIG. 18, the first passivation layer 300 is formed.

The first passivation layer 300 may be formed along the bottom surface and the inner surface of the recess TR'aT. For example, as shown in the exemplary embodiment of FIG. 18, the first passivation layer 300 may be formed directly on the gate insulating layer TR'b. The first passivation layer 300 contains fluorine.

However, exemplary embodiments of the present inventive concepts are not limited to the configuration of the first passivation layer 300 shown in FIG. 18, and the first passivation layer 300 may include a plurality of passivation layers, which have different thicknesses. Alternatively, each of the plurality of passivation layers of the first passivation layer 300 may each have the same thickness. In addition, the concentration of fluorine contained in each of the plurality of passivation layers of the passivation layer 300 may be the same or different.

Figure 19:
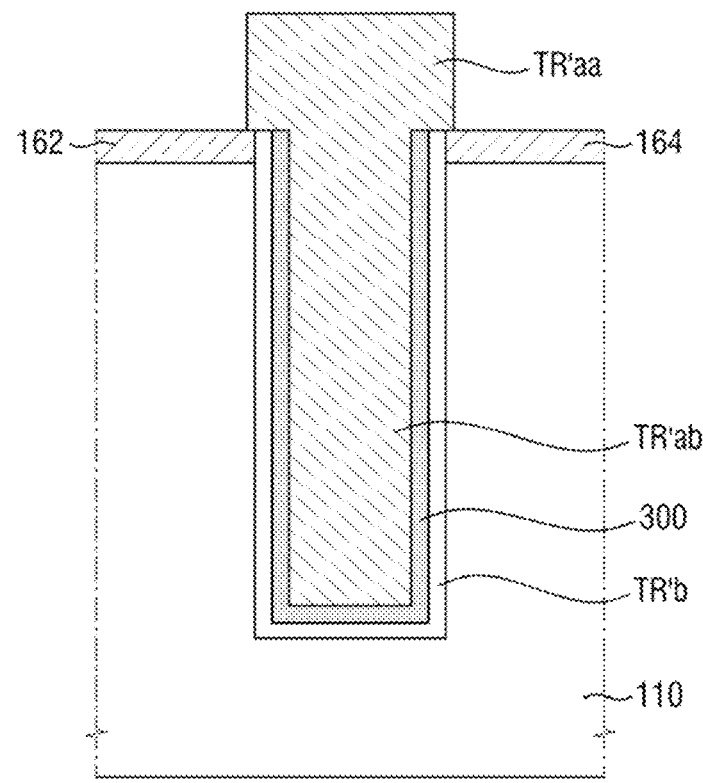

Referring to the exemplary embodiment of FIG. 19, the first gate electrode TR'aa and the second gate electrode TR'ab are then formed.

The first gate electrode TR'aa may be formed on the second gate electrode TR'ab in the Z direction). The second gate electrode TR'ab may be a portion filling the recess in the substrate 110, and the first gate electrode TR'aa may be a portion protruding from the substrate 110. For example, the second gate electrode IR'ab may directly contact the gate insulating layer TR'b.

Figure 20:
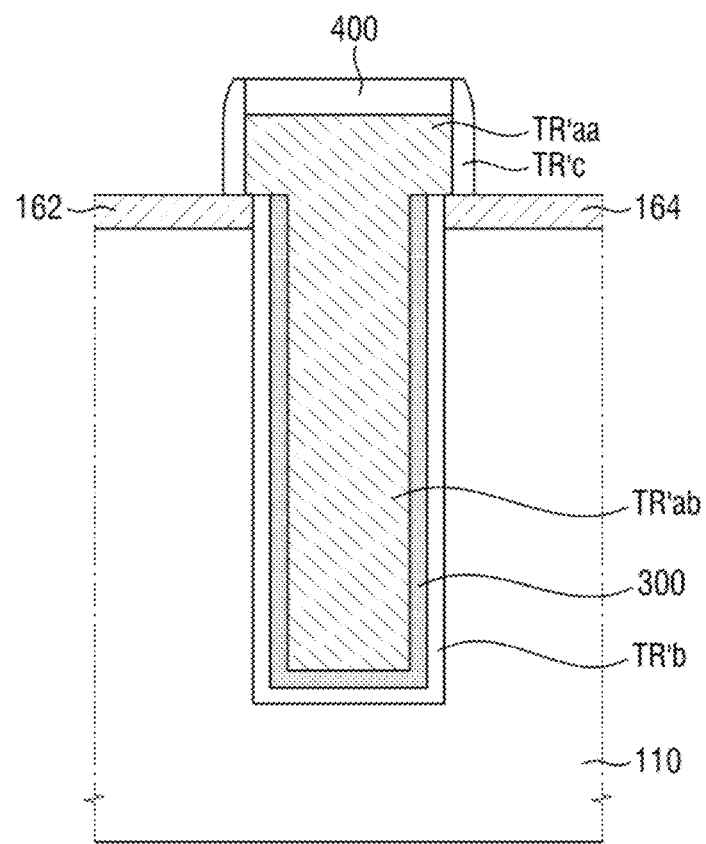

Referring to the exemplary embodiment of FIG. 20, the gate spacer TR'c and the capping layer 400 are then formed.

The capping layer 400 may be disposed on the top surface of the first gate electrode TR'aa. For example, the capping layer 400 may be disposed directly on the top surface of the first gate electrode TR'aa. In an exemplary embodiment, the capping layer 400 may include an insulating material.

The gate spacer TR'c may be formed on the lateral side surfaces of the first gate electrode TR'aa and the capping layer 400. In an exemplary embodiment, the gate spacer TR'c may include at least one compound selected from silicon oxide, silicon nitride, and silicon oxynitride. However, exemplary embodiments of the present inventive concepts are not limited thereto. Although the gate spacer TR'c in the exemplary embodiment of FIG. 20 is a single layer, the gate spacer TR'c may be a multilayer spacer in which a plurality of layers are stacked. The shape of the gate spacer TR'c and the shape of the multilayer spacer forming the gate spacer TR'c may be an I shape, an L shape or a combination thereof depending on the fabrication process or application.

The first and second source/drain contacts 152 and 156 of the exemplary embodiment of FIG. 7 are then formed on the first and second source/drain regions 162 and 164 of FIG. 20, respectively, and the gate contact 154 of FIG. 7 is formed on the capping layer 400 of FIG. 20, thereby forming the image device of FIG. 7.

What is claimed is:

1. An image device comprising:
   a first active region and a second active region disposed on a substrate;
   each of the first active region and the second active region includes:
   a gate insulating layer containing fluorine disposed on the substrate; and
   a gate electrode containing fluorine disposed on the gate insulating layer,
   wherein at least one of the first active region and the second active region further includes:
   a first passivation layer containing fluorine disposed between the gate insulating layer and the gate electrode, and
   wherein a concentration of fluorine in the gate insulating layer is higher than a concentration of fluorine in the gate electrode.

2. The image device of claim 1, wherein the second active region is a recess channel array transistor (RCAT).

3. The image device of claim 1, wherein:
   the at least one of the first active region and the second active region that includes the first passivation layer further includes a second passivation layer disposed on the first passivation layer,
   wherein the first passivation layer has a first thickness, and the second passivation layer has a second thickness.

4. The image device of claim 3, wherein the first thickness and the second thickness are different from each other.

5. The image device of claim 4, wherein the second thickness is about twice as large as the first thickness.

6. The image device of claim 3, wherein the first thickness and the second thickness are equal to each other.

7. The image device of claim 1, wherein:
   the at least one of the first active region and the second active region that includes the first passivation layer farther includes a second passivation layer containing fluorine disposed on the first passivation layer,
   wherein the first passivation layer contains fluorine at a first concentration, and the second passivation layer contains fluorine at a second concentration.

8. The image device of claim 7, wherein the first concentration and the second concentration are different from each other.

9. The image device of claim 8, wherein the first concentration is higher than the second concentration.

10. The image device of claim 7, wherein the first concentration and the second concentration are equal to each other.

11. The image device of claim 1, wherein the gate electrode of the second active region is a gate electrode of a drive transistor.

12. A fabricating method of an image device, the method comprising:

forming a gate insulating layer containing fluorine on a substrate;

forming a first passivation layer containing fluorine on the gate insulating layer; and forming a gate electrode containing fluorine on the first passivation layer;

performing a heat treatment or annealing process to diffuse fluorine in the first passivation layer;

wherein a concentration of fluorine in the gate insulating layer is higher than a concentration of fluorine in the gate electrode after the performing of the heat treatment or annealing process.

13. The method of claim 12, further comprising:

forming a second passivation layer directly on the first passivation layer, wherein the first passivation layer has a first thickness, and the second passivation layer has a second thickness.

14. The method of claim 13, wherein the first thickness and the second thickness axe different from each other.

15. The method of claim 13, wherein the first thickness and the second thickness are equal to each other.

16. The method of claim 12, wherein at least a portion of the gate insulating layer contains the fluorine from the first passivation layer.

17. The method of claim 12, further comprising:

forming a second passivation layer containing fluorine directly tin the first passivation layer, wherein the first passivation layer contains fluorine at a first concentration, and the second passivation layer contains fluorine at a second concentration.

18. The method of claim 17, wherein the first concentration and the second concentration are different from each other.

19. The method of claim 17, wherein the first concentration a d the second concentration are equal to each ether.

20. An image device comprising:

a substrate including a plurality of photoelectric conversion layers;

a first planarization layer disposed on a first surface of the substrate:

a plurality of color filters disposed on the first planarization layer;

a plurality of grid patterns located at respective boundaries between the plurality of color filters and disposed on the first planarization layer:

a second planarization layer disposed on the plurality of color filters; a plurality of microlenses disposed on the second planarization layer: and a plurality of transistors formed on a second surface of the substrate that faces the first surface of the substrate, wherein each of the plurality of transistors includes:

a gate insulating layer containing fluorine disposed on the substrate:

a gate electrode containing fluorine disposed on the gate insulating layer: and a spacer formed on sidewalls of the gate insulating layer and the gate electrode, wherein at least one of the plurality of transistors further includes a first passivation layer containing fluorine disposed between the gate insulating layer and the gate electrode, and wherein the at least one of the plurality of transistors that includes the first passivation layer, a concentration of fluorine in the gate insulating layer is higher than a concentration of fluorine in the gate electrode.

* * * * *